United States Patent
Tsuji et al.

(10) Patent No.: US 9,252,218 B2
(45) Date of Patent: Feb. 2, 2016

(54) SILICON CARBIDE SEMICONDUCTOR ELEMENT AND FABRICATION METHOD THEREOF

(71) Applicant: FUJI ELECTRIC CO., LTD., Kawasaki-shi, Kanagawa (JP)

(72) Inventors: Takashi Tsuji, Tsukuba (JP); Akimasa Kinoshita, Tsukuba (JP); Kenji Fukuda, Tsukuba (JP)

(73) Assignee: FUJI ELECTRIC CO., LTD., Kawasaki-shi (JP)

(*) Notice: Subject to any disclaimer, the term of this patent is extended or adjusted under 35 U.S.C. 154(b) by 0 days.

(21) Appl. No.: 14/387,487

(22) PCT Filed: Mar. 18, 2013

(86) PCT No.: PCT/JP2013/057740
§ 371 (c)(1),
(2) Date: Sep. 23, 2014

(87) PCT Pub. No.: WO2013/146446
PCT Pub. Date: Oct. 3, 2013

(65) Prior Publication Data
US 2015/0048383 A1  Feb. 19, 2015

(30) Foreign Application Priority Data

Mar. 30, 2012  (JP) ................. 2012-081906

(51) Int. Cl.
*H01L 31/0312* (2006.01)
*H01L 29/16* (2006.01)
(Continued)

(52) U.S. Cl.
CPC ........ *H01L 29/1608* (2013.01); *H01L 21/0485* (2013.01); *H01L 21/283* (2013.01);
(Continued)

(58) Field of Classification Search
CPC ............... H01L 29/1608; H01L 29/66068; H01L 29/1602; H01L 29/7802; H01L 29/45
USPC ................... 257/77, 764, 766, 768
See application file for complete search history.

(56) References Cited

U.S. PATENT DOCUMENTS

| 6,599,644 B1 * | 7/2003 | Zekentes ............. H01L 21/0485 257/750 |
| 2006/0273323 A1 * | 12/2006 | Yamamoto .......... H01L 29/1608 257/77 |

(Continued)

FOREIGN PATENT DOCUMENTS

| JP | 2006-344588 A | 12/2006 |
| JP | 2006-344688 A | 12/2006 |

(Continued)

OTHER PUBLICATIONS

Eizenberg et al., "Reactively sputtered titanium carbide thin films: Preparation and properties", J. Appl. Phys., vol. 54, No. 6, Jun. 1983, pp. 3190-3194.

(Continued)

*Primary Examiner* — Quoc Hoang
(74) *Attorney, Agent, or Firm* — Westerman, Hattori, Daniels & Adrian, LLP

(57) ABSTRACT

An $Ni_2Si$ layer and a TiC layer formed by sintering after deposition of a thin layer including Ni and a thin layer including Ti on a silicon carbide substrate have a structure in which the TiC layer is precipitated on a surface of the $Ni_2Si$ layer. A multilayer thin film including a Ti layer as a first thin film and an Ni layer as a second thin film is formed on the TiC layer surface in the structure. A TiC-derived C composition ratio is set to 15% or more at an interface between the TiC layer and the Ti layer of the multilayer thin film. As a result, a silicon carbide semiconductor element can be provided without occurrence of peeling after wafer dicing and subsequent picking up by a dicing tape.

3 Claims, 12 Drawing Sheets

(51) Int. Cl.
  *H01L 29/40* (2006.01)
  *H01L 29/43* (2006.01)
  *H01L 29/47* (2006.01)
  *H01L 21/04* (2006.01)
  *H01L 21/283* (2006.01)
  *H01L 29/45* (2006.01)
  H01L 29/78 (2006.01)
  H01L 29/872 (2006.01)

(52) U.S. Cl.
  CPC ............ *H01L 29/40* (2013.01); *H01L 29/43* (2013.01); *H01L 29/45* (2013.01); *H01L 29/47* (2013.01); *H01L 29/78* (2013.01); *H01L 29/872* (2013.01)

(56) References Cited

U.S. PATENT DOCUMENTS

2007/0138482 A1 6/2007 Tanimoto
2010/0207125 A1 8/2010 Uchida et al.

FOREIGN PATENT DOCUMENTS

JP 2007-184571 A 7/2007
JP 2010-62524 A 3/2010
WO 2009/054140 A1 4/2009

OTHER PUBLICATIONS

Levit et al., "Interaction of Ni90Ti10 alloy thin film with 6H—SiC single crystal", J. Appl. Phys., vol. 80, No. 1, Jul. 1996, pp. 167-173.
Tanimoto e t al., "Ohmic Contact Structure and Fabrication Process Applicable to Practical SiC Devices", Materials Science Forum, vols. 389-393, 2002, pp. 879-884.
Tanimoto et al., "Reliability issues of SiC power MOSFETs toward high junction temperature operation", Phys. Status Solidi A 206, No. 10, 2009, pp. 2417-2430.
International Search Report dated Jun. 25, 2013 issued in corresponding application No. PCT/JP2013/057740.
Notification of Transmittal of Translation of the International Preliminary Report on Patentability (Chapter I or Chapter II) (Form PCT/IB/338) of International Application No. PCT/JP2013/057740 mailed Oct. 9, 2014 with Forms PCT/IB/373, PCT/IB/326 and PCT/ISA/237. (14 pages).

* cited by examiner

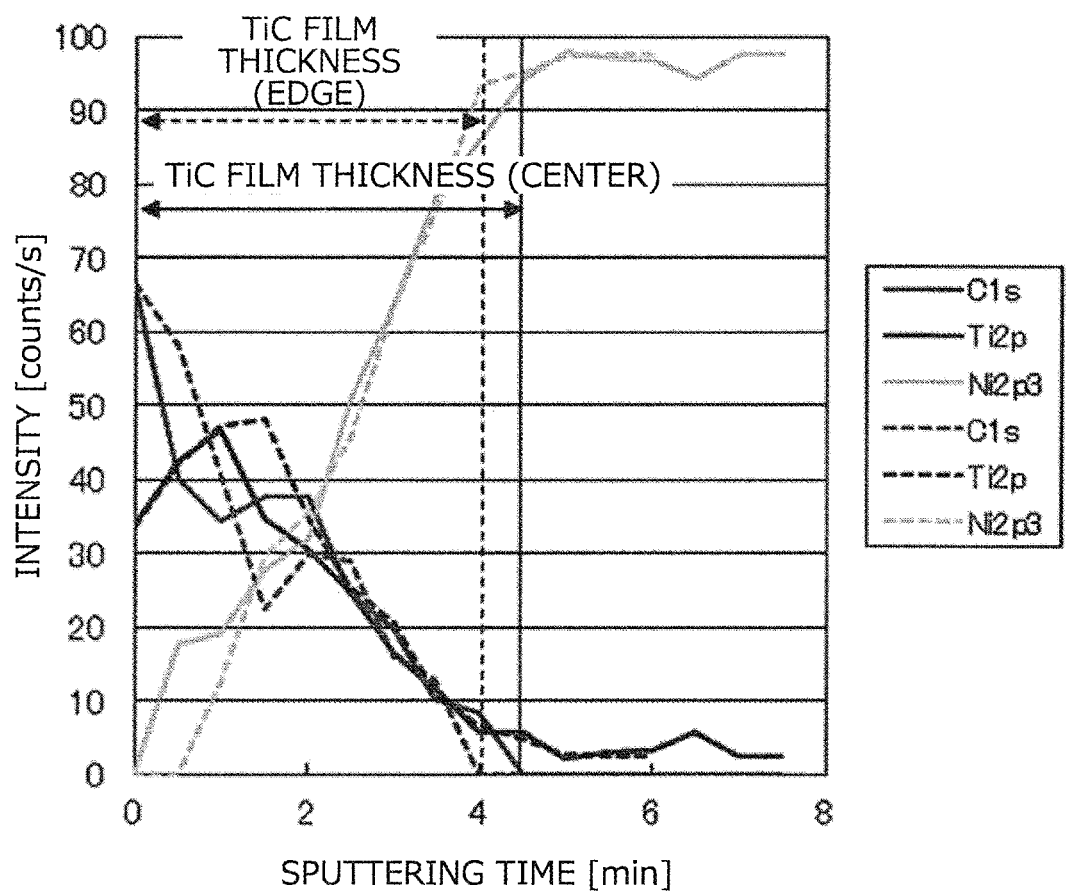

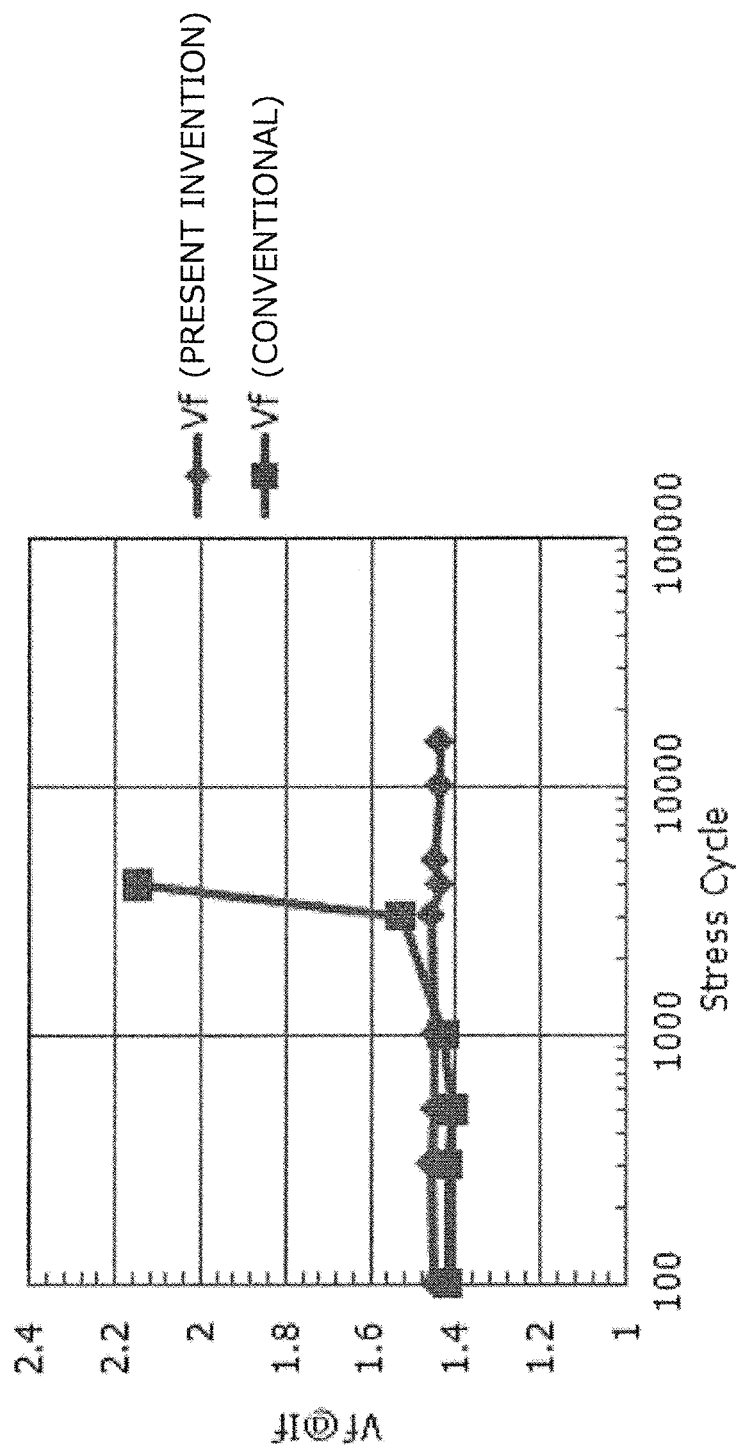

SILICON CARBIDE SEMICONDUCTOR ELEMENT AND FABRICATION METHOD THEREOF

TECHNICAL FIELD

The present invention relates to a semiconductor element using silicon carbide (hereinafter also referred to as "SiC") as semiconductor material and particularly to a vertical power device semiconductor element to which current is applied from a front side to a backside and a fabrication method thereof.

BACKGROUND ART

A silicon carbide semiconductor has a large band gap as compared to a silicon semiconductor and therefore, has high insulation breakdown field intensity. In the silicon carbide semiconductor, on-resistance is resistance in a conductive state and is inversely proportional to the cube of the insulation breakdown field intensity. Therefore, for example, widely used silicon carbide semiconductors called a 4H type can suppress the on-resistance to a few hundredths as compared to silicon semiconductors. A semiconductor element using a silicon carbide semiconductor also has high thermal conductivity characteristics facilitating heat radiation and therefore, is expected to be a next-generation, low-loss power device.

Power semiconductor elements generally have a vertical structure in which current is applied from the front side toward the backside. This is mainly because the proportion of an electrode pad, which is an element, to the total area is not negligible and the same current can be realized with a smaller area by forming one electrode on a wafer back surface. A back surface electrode is bonded through a solder layer to a copper (Cu) plate called direct bonded copper (DBC). On the other hand, a front surface electrode is wire-bonded to one end of an aluminum (Al) wire by ultrasonic waves and the other end of the Al wire is bonded to the DBC.

Two main capabilities are required of the back surface electrode of the power semiconductor element as described above. One is to reduce ohmic contact resistance at a metal/semiconductor interface and the other is to increase adhesive strength with the solder layer. For lower ohmic contact resistance, it is known that after deposition of nickel (Ni) on the wafer back surface, a nickel silicide ($Ni_2Si$) layer may be formed by sintering at a temperature equal to or greater than 900 degrees C. in a reduction atmosphere. By forming the $Ni_2Si$ layer, a favorable value of $10^{-7}$ $\Omega cm^2$ is obtained as the contact resistance at a substrate (wafer) concentration of $10^{19}$ $cm^{-3}$ (see, e.g., Patent Document 1).

However, in the method described above, as can be seen from Equation (1), carbon with a graphite structure is formed on the top surface. A portion of this graphite is precipitated on the $Ni_2Si$ layer surface and stable in terms of energy.

$$SiC+2Ni \rightarrow Ni_2Si+C \qquad (1)$$

FIG. 2 is a schematic of layer structure at a stage when an ohmic layer is formed by sintering after deposition of Ni on an SiC substrate. As depicted in FIG. 2, at the stage when the ohmic layer is formed, a structure of a graphite layer/an $Ni_2Si$ layer/the SiC substrate is formed from the surface side (exposed surface side) of the ohmic layer. For bonding with solder, for example, a multilayer film obtained by sequentially depositing titanium (Ti), Ni, and gold (Au) is formed on this ohmic layer, and it is known that the peeling of the multilayer film occurs due to the graphite layer precipitated on the top surface of the ohmic layer (see. e.g., Patent Document 2).

In a method proposed as one measure for suppressing the peeling of the multilayer film due to the graphite layer, after depositing not only Ni but also Ti on the SiC substrate, the ohmic layer is formed by performing the sintering to obtain the ohmic contact with the silicon carbide semiconductor (for forming the ohmic layer) and the multilayer film is then formed on the ohmic layer (see, e.g., Patent Document 1). Ni has reaction enthalpy with Si lower than carbon (C), and Ti has reaction enthalpy with C lower Si. Therefore, as represented by Equation (2), carbon released from SiC is converted by reaction with Ti into TiC.

$$SiC+2Ni+Ti \rightarrow Ni_2Si+TiC \qquad (2)$$

FIG. 3 is a schematic of layer structure at the stage when an ohmic layer is formed by sintering after deposition of Ni and Ti on an SiC substrate. At the stage when the ohmic layer is formed in this case, the layer structure from the surface side of the ohmic layer is a TiC layer/an $Ni_2Si$ layer/the SiC substrate, as depicted in FIG. 3 (see. e.g., Patent Document 3). For example, by forming a multilayer film obtained by sequentially depositing Ti, Ni, and Au on this TiC layer, adhesiveness between the ohmic layer and the multilayer film becomes very good.

Patent Document 1: Japanese Laid-open Patent Publication No. 2006-344588
Non-Patent Literature 1: S. Tanimoto, et al, Materials Science Forum, Vols. 389-393 (2002), p. 879
Non-Patent Literature 2: S. Tanimoto, et al, Phys. Status SolidiA 206, No. 10, pp. 2417-2430 (2009)
Non-Patent Literature 3: M. Levit, et al, J. Appl. Phys., Vol. 80, No. 1 (1996) pp. 167-173

DISCLOSURE OF INVENTION

Problem to be Solved by the Invention

However, at an actual element fabrication step, a three-layer film including Ti, Ni, and Au is not formed immediately after formation of an ohmic layer, and various steps exist depending on the type of an element before the formation.

For example, taking a Schottky barrier diode as an example, the steps after formation of the ohmic layer (TiC layer+$Ni_2Si$ layer) are formation of a Schottky contact hole, formation of Schottky metal, formation of Al—Si metal, and formation of a polyimide layer on the wafer front side. The ohmic layer formation step is performed before these steps because of high sintering temperature of the ohmic layer equal to or greater than 900 degrees C. The three-layer film including Ti, Ni, and Au is formed at the end of preceding steps (steps including the ohmic layer formation step, the steps performed on the wafer front side, and the three-layer film formation step) to prevent cross contamination of Au into a fabrication line. The three-layer film including Ti, Ni, and Au deposited at the end of the preceding steps will hereinafter be referred to as "back surface three-layer metal".

As a result of study by the present inventors, it is found that if the steps are performed for the Schottky contact hole formation, the Schottky metal formation, the Al—Si metal formation, the polyimide layer formation, etc., after the ohmic layer formation and before the back surface three-layer metal formation, even though the ohmic layer is formed such that the $Ni_2Si$ layer and the TiC layer formed thereon are precipitated so as to make up a back surface electrode, a problem is generated that the peeling of the back surface three-layer metal occurs after wafer dicing and subsequent picking up from a dicing tape (adhesive force: 0.2 N/20 mm).

The present invention was conceived in view of the problem and it is therefore an object of the present invention to provide a silicon carbide semiconductor element and a fabrication method thereof where peeling of a back surface electrode after wafer dicing and subsequent picking up from a dicing tape does not occur.

Means for Solving Problem

As a result of intensive studies for achieving an object, the present inventors obtained knowledge that in a back surface electrode structure that has a thin film (ohmic layer) including an $Ni_2Si$ layer and a TiC layer formed by sintering after deposition of a thin layer of Ni and a thin layer of Ti on a silicon carbide substrate with the TiC layer precipitated on a surface and that further has a multilayer thin film including a Ti layer as a first thin film and an Ni layer as a second thin film sequentially deposited on the TiC layer surface, a TiC-derived C composition ratio may be set to 15% or more at an interface between the TiC layer and the Ti layer of the multilayer thin film.

It is also found that in the formation of the back surface electrode structure, a film thickness ratio may be set to Ti/Ni=0.2 to 0.67 for the thin layer including Ti and the thin layer including Ni deposited before the sintering to obtain ohmic contact with a silicon carbide semiconductor.

It is also found that a step of depositing a thin Ti film on the TiC layer may be inserted between a step of forming the thin film (ohmic layer) including the $Ni_2Si$ layer and the TiC layer with the TiC layer located on the surface side and a step of sequentially depositing the multilayer thin film including the Ti layer as the first thin film and the Ni layer as the second thin film on the ohmic layer in the back surface electrode structure described above.

The present invention was completed based on the knowledge and, according to the present invention, the following aspects of the invention are provided.

To solve the problems above and achieve an object, a silicon carbide semiconductor element according to the present invention has the following characteristics. The silicon carbide semiconductor element has a structure in which a thin film of $Ni_2Si$ and TiC formed by sintering after deposition of a thin layer including Ni and a thin layer of Ti is disposed on a silicon carbide substrate and has a layer including TiC formed by TiC precipitation on a surface. The silicon carbide semiconductor element is further structured such that a multilayer thin film is formed on a surface of the layer including TiC. The multilayer thin film includes a Ti layer as a first thin film and an Ni layer as a second thin film. A composition ratio of C derived from the layer including TiC is 15% or more at an interface between the layer including TiC and the Ti layer of the multilayer thin film.

To solve the problems above and achieve an object, a silicon carbide semiconductor element fabrication method according to the present invention is a fabrication method for the silicon carbide semiconductor element above and has the following characteristics. A process (A) of depositing a thin layer including Ni and a thin layer including Ti on the silicon carbide substrate is performed. After the process (A) of depositing the thin layers, a process (B) of sintering to form a thin film including $Ni_2Si$ and TiC on the silicon carbide substrate such that the TiC precipitates on a surface to form a layer including TiC is performed. A process (C) of forming a multilayer thin film including the Ti layer as the first thin film and the Ni layer as the second thin film on the surface of the layer including TiC is performed. At the process (A) of depositing the thin layers, a film thickness ratio (Ti/Ni) of the thin layer including Ti and the thin layer including Ni is set to 0.25 to 0.67.

In the silicon carbide semiconductor element fabrication method according to the present invention, a process (D) of depositing a thin film including Ti is performed between the process (B) of performing the sintering and the process (C) of forming the multilayer thin film.

Effect of the Invention

A silicon carbide semiconductor element and a fabrication method thereof according to the present invention produce an effect that a silicon carbide semiconductor element can be obtained without the peeling of a back surface electrode after wafer dicing and subsequent picking up from a dicing tape.

BRIEF DESCRIPTION OF DRAWINGS

FIG. 7B is a diagram of the result of measurement of the depth direction profile of Ti and C using XPS after ammonia hydrogen peroxide water treatment;

FIG. 10 is a diagram of the result of a power cycle test.

BEST MODE(S) FOR CARRYING OUT THE INVENTION

Preferred embodiments of a silicon carbide semiconductor element and fabrication method thereof according to the present invention will be described in detail with reference to the accompanying drawings.

Figure 1:
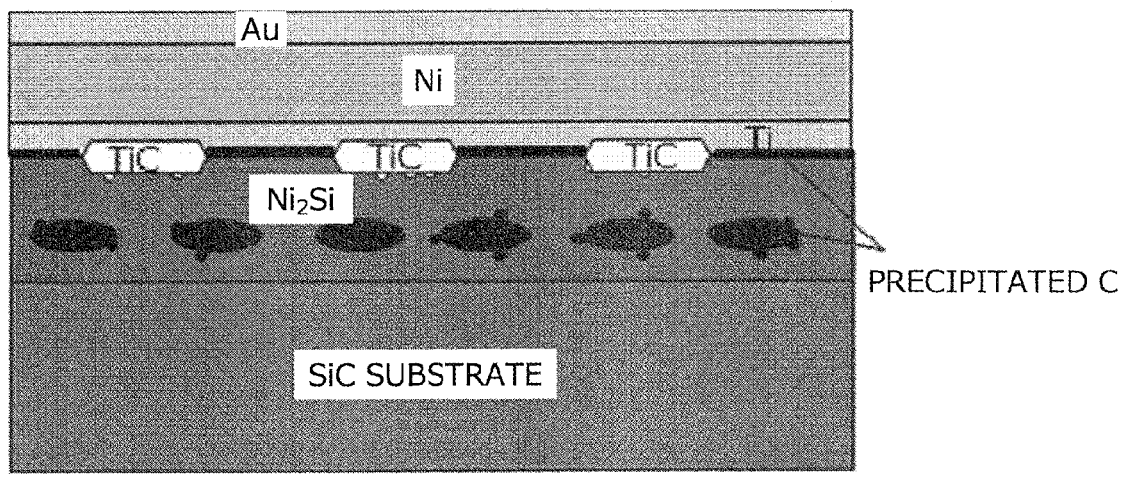
FIG. 1 is a schematic of a layer configuration of an embodiment of a silicon carbide semiconductor element of the present invention.
Figure 2:
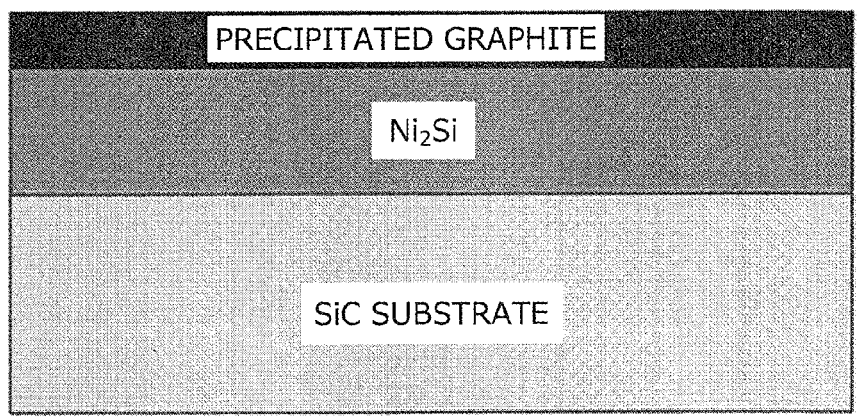
FIG. 2 is a schematic of layer structure at a stage when an ohmic layer is formed by sintering after deposition of Ni on an SiC substrate
Figure 3:
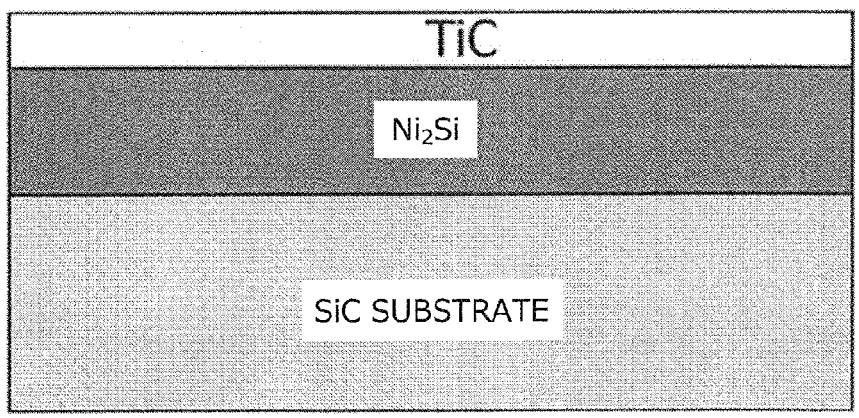
FIG. 3 is a schematic of layer structure at the stage when an ohmic layer is formed by sintering after deposition of Ni and Ti on an SiC substrate.

FIG. 1 is a schematic of a layer configuration of an embodiment of a silicon carbide semiconductor element of the present invention. As depicted in FIG. 1, the silicon carbide semiconductor element of the present invention has a structure including a thin film (ohmic layer) including an $Ni_2Si$ layer and a TiC layer formed by sintering after deposition of a thin layer including Ni and a thin layer including Ti on a silicon carbide (SiC) substrate with the TiC layer precipitated on a surface of the ohmic layer. On a surface of the TiC layer, a multilayer thin film (back surface three-layer metal) is sequentially deposited that includes a Ti layer as a first thin film and a Ni layer as a second thin film. At an interface between the TiC layer and the Ti layer of the first thin film, a TiC-derived C composition ratio is set higher to 15% or more to prevent peeling of the back surface three-layer metal (Ti/Ni/Au).

(Verification of Peeling Mechanism)

Peeling mechanism verified by the present inventors will first be described.

To investigate the cause of the peeling, first, a peeling location in a depth direction was investigated and it was found that a peeling surface was an interface between the ohmic layer and the Ti layer of the back surface three-layer metal in every wafers.

To clarify the mechanism leading to the peeling of the back surface three-layer metal, a region including the peeling interface was analyzed.

Figure 4A:
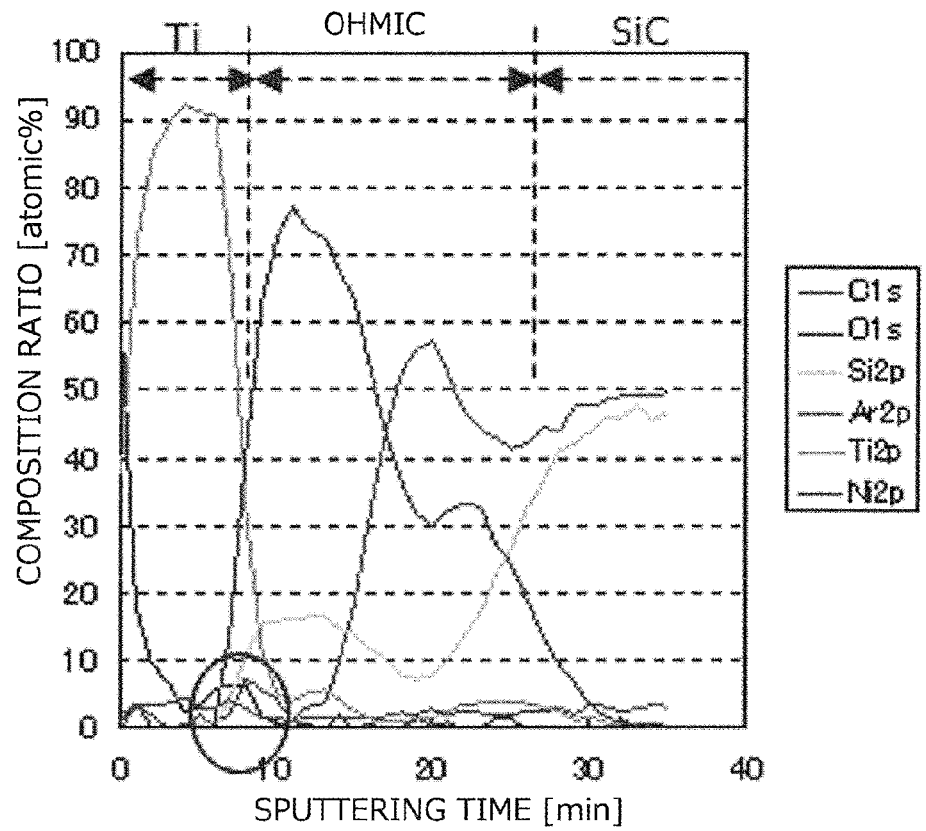
FIG. 4A is a diagram of measurement of profiles of elements in a depth direction near a peeling interface of a wafer with X-ray photoelectron spectroscopy (XPS)
Figure 4B:
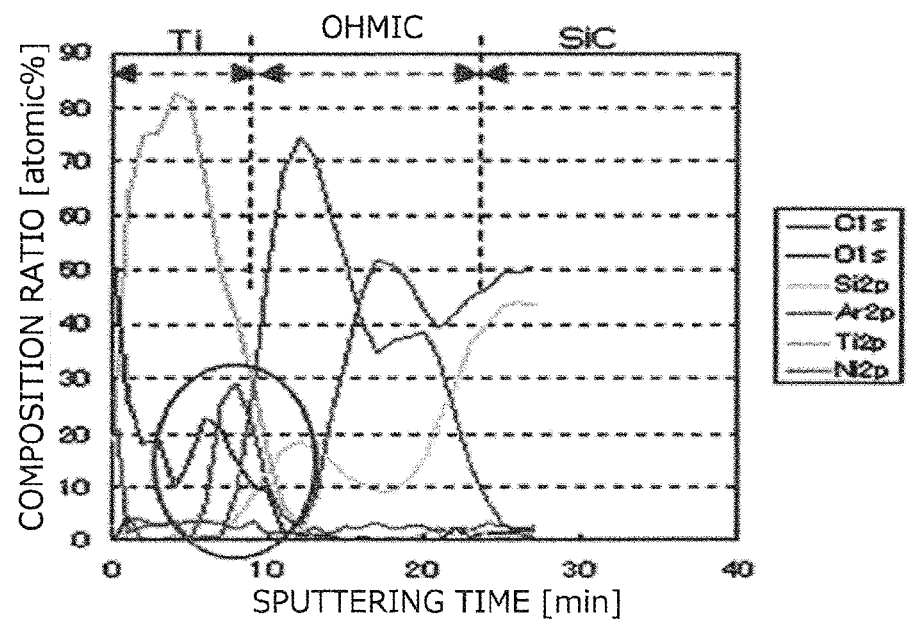
FIG. 4B is a diagram of measurement of profiles of elements in the depth direction in a closely-attached portion of the wafer with X-ray photoelectron spectroscopy (XPS)

First, X-ray photoelectron spectroscopy (XPS) was used to measure profiles of elements in the depth direction near the peeling interface. To protect information near the peeling interface (interface between the ohmic layer and the Ti layer of the back surface three-layer metal), only an Au layer and an Ni layer corresponding to upper layers were removed by aqua regalis and phosphoric nitric acetic acid solution rather than entirely peeling the back surface three-layer metal. Even in a wafer with the back surface three-layer metal peeled, the back surface three-layer metal is not entirely peeled and therefore, measurement was performed in a region without the peeling of the back surface three-layer metal. The results are depicted in FIGS. 4A and 4B. FIG. 4A is a diagram of measurement of profiles of elements in the depth direction near a peeling interface of a wafer with X-ray photoelectron spectroscopy (XPS). FIG. 4B is a diagram of measurement of profiles of elements in the depth direction in a closely-attached portion of the wafer with X-ray photoelectron spectroscopy (XPS).

From the results depicted in FIGS. 4A and 4B, a difference was recognized in composition of carbon present in the peeling interface between a wafer with the back surface three-layer metal peeled and a wafer without the peeling of the back surface three-layer metal. In particular, it was found that, the wafer with the back surface three-layer metal peeled had low carbon composition of several percent at the peeling interface as depicted in FIG. 4A, while the wafer with the back surface three-layer metal closely attached without peeling had high composition of carbon present at the peeling interface, which is 20 percent or higher, as depicted in FIG. 4B.

A binding state of carbon was examined from a chemical shift of XPS spectrums in the wafer with the back surface three-layer metal closely attached without peeling.

Figure 5A:
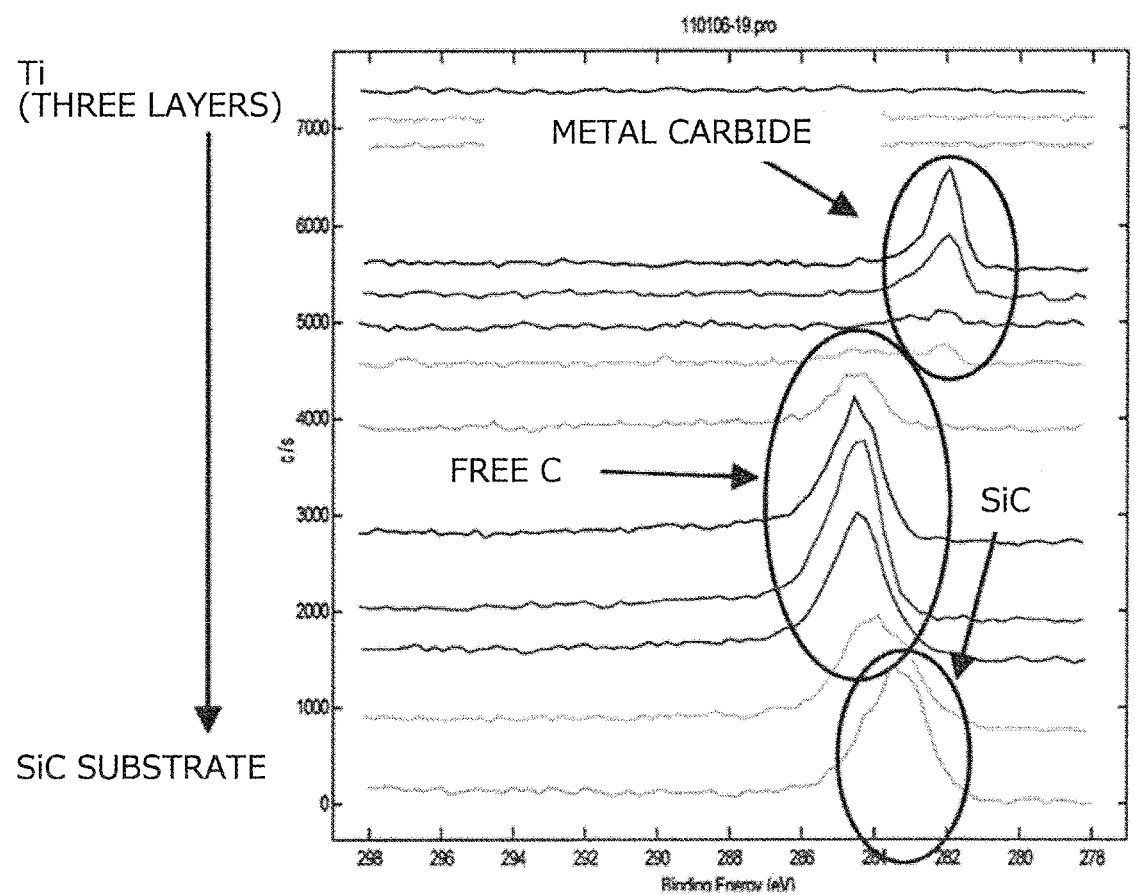
FIG. 5A is a diagram of a C1s spectrum from XPS.
Figure 5B:
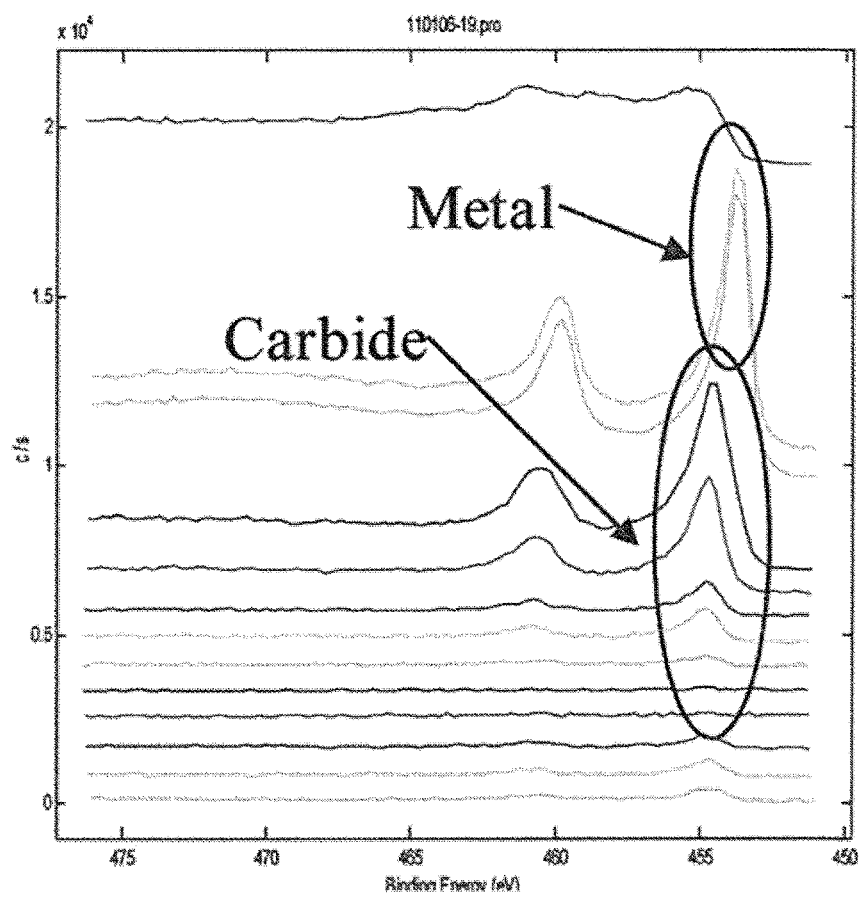
FIG. 5B is a diagram of a Ti2p spectrum from XPS.
Figure 5C:
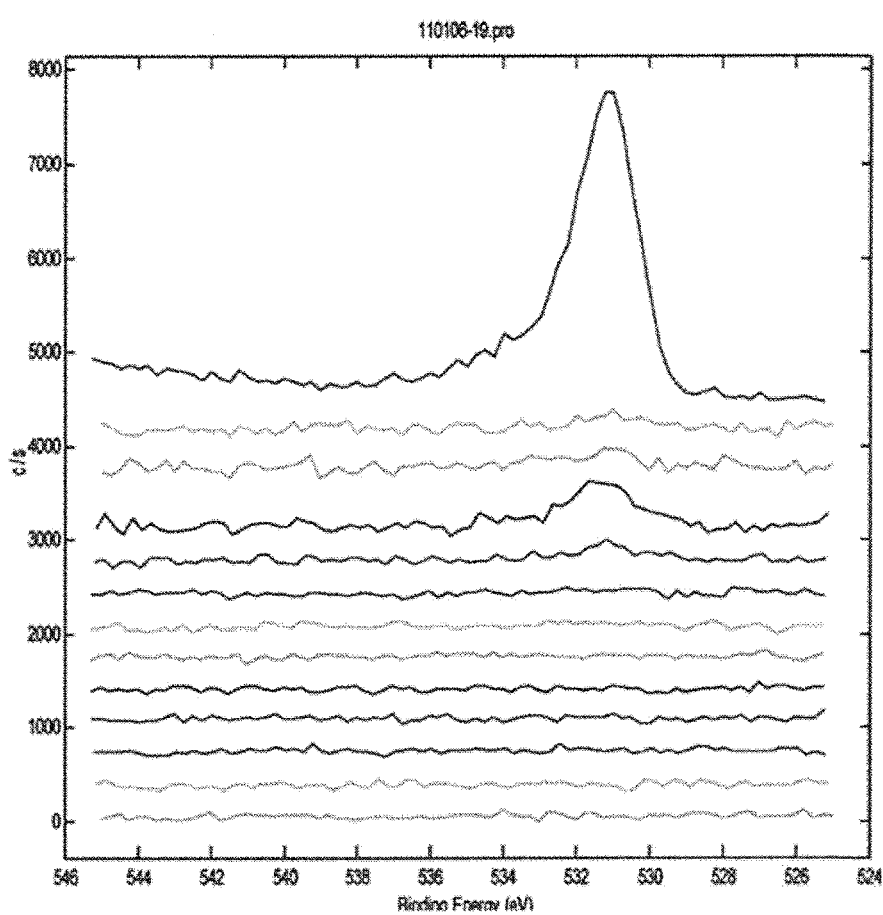
FIG. 5C is a diagram of an O1s spectrum from XPS.

A C1s spectrum, a Ti2p spectrum, and an O1s spectrum are respectively depicted in FIGS. 5A to 5C. FIG. 5A is a diagram of the C1s spectrum from XPS. FIG. 5B is a diagram of the Ti2p spectrum from XPS. FIG. 5C is a diagram of the O1s spectrum from XPS.

As a result, from the chemical shift of C1s (FIG. 5A), it is found that carbon detected at the peeling interface is in a state of binding with a metal element. On the other hand, examining the chemical shift of Ti2p (FIG. 5B), it was found that the binding state of TiO or TiC is present at the peeling interface. As indicated by the chemical shift of O1s (FIG. 5C), almost no oxygen element is detected at the peeling interface and therefore, it is concluded that the TiC layer is present at the peeling interface.

The back surface electrode structure was produced under various conditions to arrange the TiC-derived carbon composition at the peeling interface. The peeling always occurred when a TiC-derived C composition ratio was equal to or less than 10% and often occurred when the TiC-derived C composition ratio was 10 to 15%, and no peeling occurred when the TiC-derived C composition ratio was equal to or greater than 15%. As described above, it was found that the amount of TiC present at the interface between the ohmic layer and the Ti layer of the back surface three-layer metal is a parameter having influence on the peeling.

In terms of why the peeling occurs when the TiC amount decreases, the mechanism thereof is unknown. Therefore, it is predicted as a part of examination that even when the TiC amount decreases, if the TiC amount is uniformly distributed over the entire back surface, the binding state between the TiC layer and the Ti layer of the back surface three-layer metal does not change and therefore, the adhesive strength does not change, while if the TiC layer is in a mosaic state in the surface such that a substance with low binding force is exposed, the adhesive strength is reduced.

It is also known that the TiC layer is etched by ammonia hydrogen peroxide water and phosphoric nitric acetic acid solution used at a fabrication step and is not etched by buffered hydrofluoric acid (BHF) (reference: M. Eizenberg and S. P. Mararka, J. Appl. Phys., Vol. 54, No. 6 (1983) pp. 3190-3194). Therefore, it is also predicted that the TiC layer is put into a mosaic state due to etching by chemical solution.

To verify the assumed mechanism as described above, element surface mapping using Auger electron spectroscopy (AES) and depth direction profile using XPS were conducted. Four types of wafers were examined and were (a) those subjected only to the ohmic layer formation process (i.e. those immediately after sintering to obtain ohmic contact with the silicon carbide semiconductor), (b) those going through the steps from ohmic layer formation to Schottky metal formation (i.e., after ammonia hydrogen peroxide water treatment), (c) those going through the steps from ohmic layer formation to Al—Si metal formation (i.e., after phosphoric nitric acetic acid etching), and (d) those going through the steps from ohmic layer formation immediately before back surface three-layer metal formation (i.e., after BHF etching).

Figure 6:
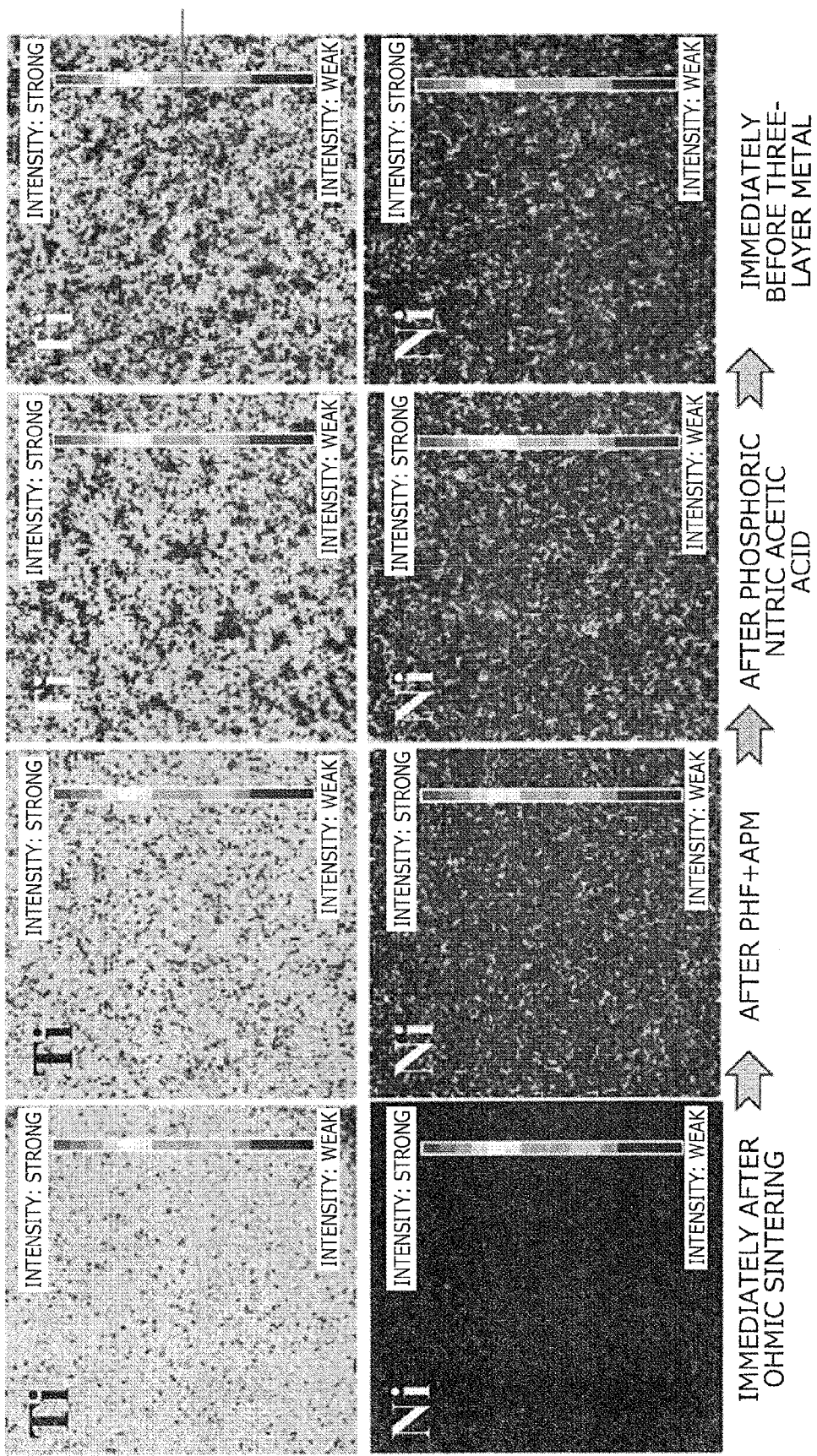
FIG. 6 is a diagram of transition of AES mapping (10 µm) of Ti (upper row) and Ni (lower row)

FIG. 6 is a diagram of transition of AES mapping (10 μm) of Ti (upper row) and Ni (lower row). As can be seen from FIG. 6, in (a), i.e., immediately after the ohmic layer formation step, since Ti is uniformly formed and Ni is almost not detected, it is estimated that the TiC layer is uniformly deposited in the surface. As the steps proceed from (b) through (c) to (d), the distribution of Ti in the surface becomes sparse and the peaks of Ni are increased in a region where the peaks of Ti are reduced. Therefore, it is estimated that as the steps proceed, the TiC layer is partially etched while the underlying $Ni_2Si$ layer is gradually exposed and, thus, the assumed mechanism is verified.

Figure 7A:
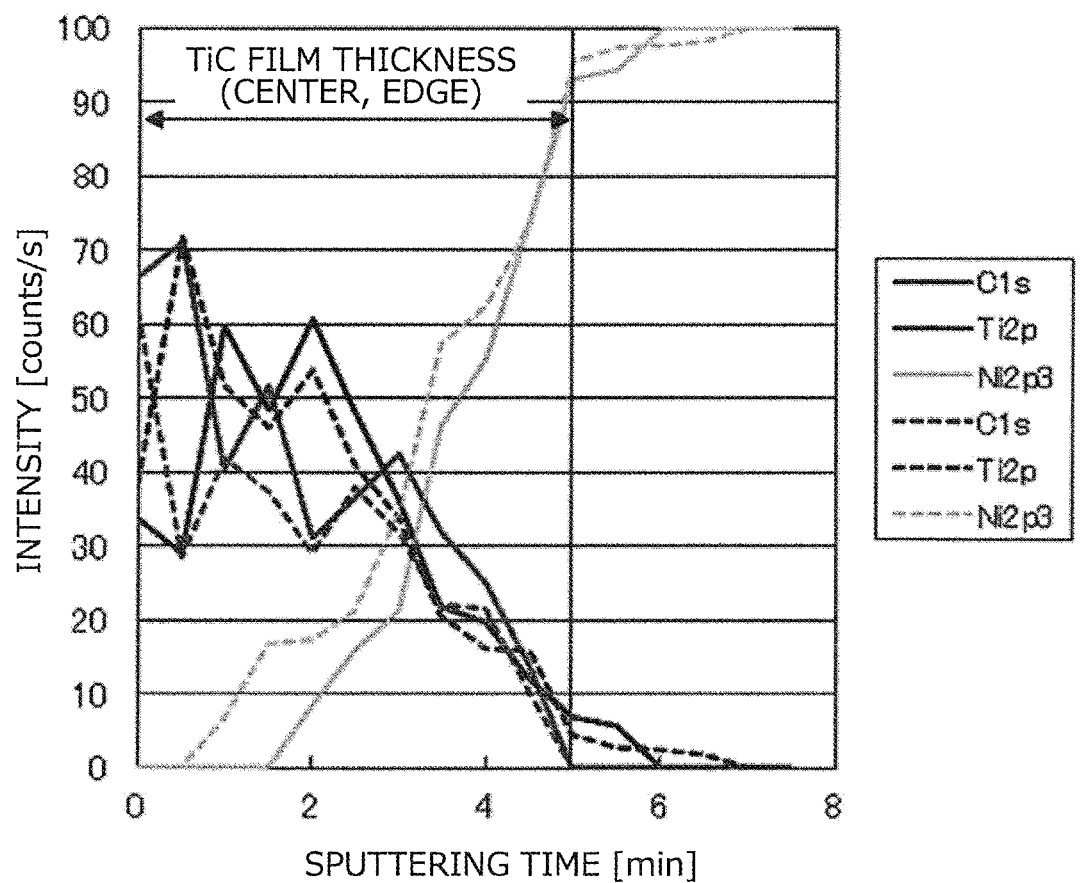
FIG. 7A is a diagram of the result of measurement of the depth direction profile of Ti and C using XPS immediately after sintering to obtain ohmic contact with the silicon carbide semiconductor.
Figure 7C:
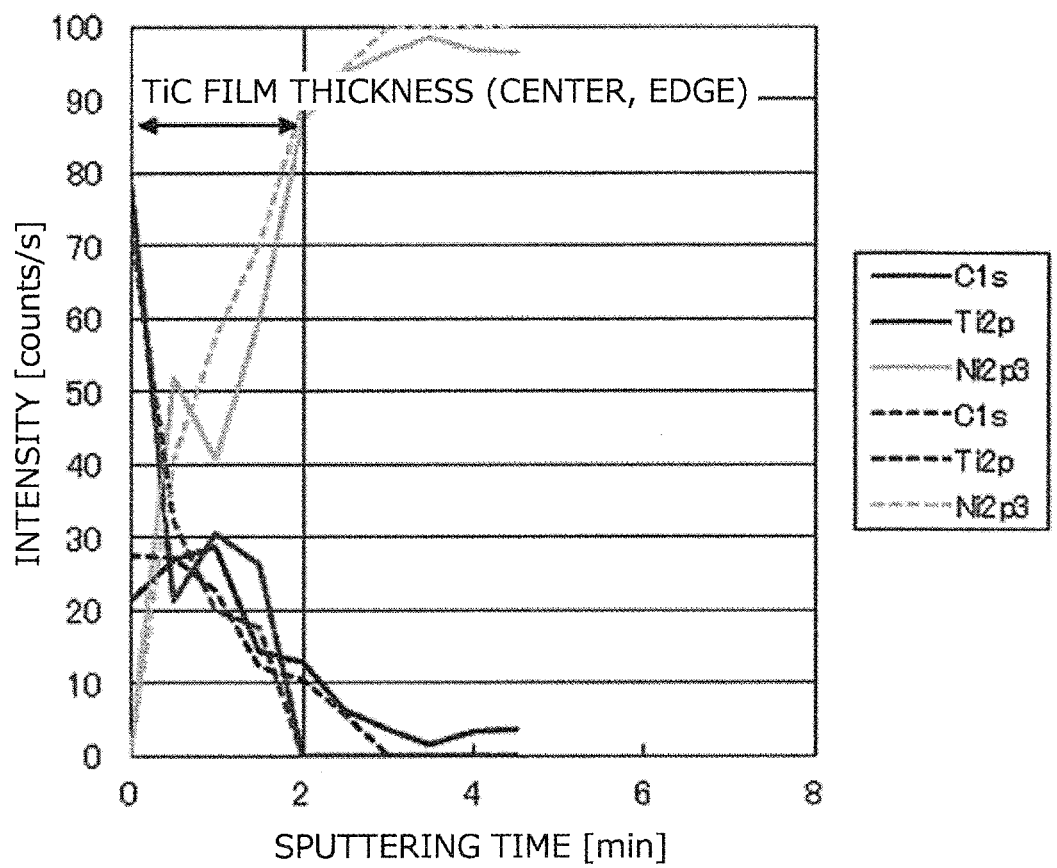
FIG. 7C is a diagram of the result of measurement of the depth direction profile of Ti and C using XPS after phosphoric nitric acetic acid etching.
Figure 7D:
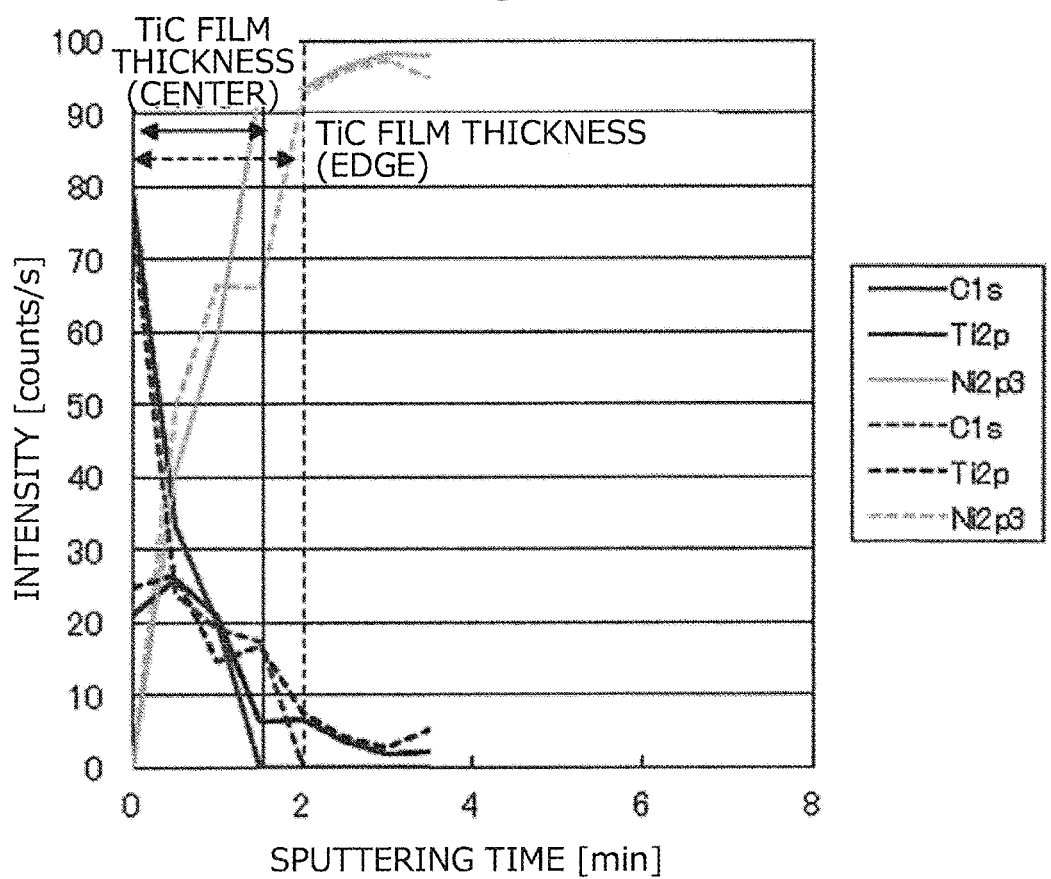
FIG. 7D is a diagram of the result of measurement of the depth direction profile of Ti and C using XPS after BHF etching.

FIGS. 7A to 7D depict the results of the depth direction profile of Ti and C using XPS. FIG. 7A is a diagram of the result of measurement of the depth direction profile of Ti and C using XPS immediately after sintering to obtain ohmic contact with the silicon carbide semiconductor. FIG. 7B is a diagram of the result of measurement of the depth direction profile of Ti and C using XPS after ammonia hydrogen peroxide water treatment. FIG. 7C is a diagram of the result of measurement of the depth direction profile of Ti and C using XPS after phosphoric nitric acetic acid etching. FIG. 7D is a diagram of the result of measurement of the depth direction profile of Ti and C using XPS after BHF etching. Therefore, FIGS. 7A, 7B, 7C, and 7D depict a wafer of (a), a wafer of (b), a wafer of (c), and a wafer of (d), respectively.

It can first be seen from FIGS. 7A to 7D that as the steps proceed, film thickness of detection of Ti and C, i.e., the film thickness of the TiC layer decreases. It can also be seen that the decrease in the film thickness of the TiC layer is larger in FIGS. 7A to 7C. Since the step of ammonia hydrogen peroxide water is already performed in FIG. 7B and the step of phosphoric nitric acetic acid is already performed in FIG. 7C, the TiC layer is etched and, although the step of buffered hydrofluoric acid is already performed in FIG. 7D, the TiC layer is not etched. From these results, it is contemplated that the cause of etching of the TiC layer is wet etching liquid used in the steps, or particularly, ammonia hydrogen peroxide water and phosphoric nitric acetic acid solution.

Examination and study were also conducted for the mechanism leading to the peeling of the back surface three-layer metal when the TiC amount decrease and the $Ni_2Si$ layer is exposed at the peeling interface.

At the time of formation of Schottky metal, annealing is performed at a temperature of 500 degrees C. after the ammonia hydrogen peroxide water treatment. At the polyimide formation step after the Al—Si metal formation, annealing is performed at a temperature of 350 degrees C. for curing of polyimide. According to the report of Tanimoto et al., it is suggested that a portion of carbon dispersed in the $Ni_2Si$ layer is diffused again by annealing at 100 to 600 degrees C. and is precipitated as graphite on the surface of the $Ni_2Si$ layer stable in terms of energy (see. e.g., Japanese Laid-Open Patent Publication No. 2007-184571).

Also in this step, carbon dispersed in the $Ni_2Si$ layer is absorbed by the TiC layer in a region with the surface of that $Ni_2Si$ layer covered by the TiC layer in the ohmic layer. On the other hand, in a region with the $Ni_2Si$ layer exposed on the surface without being covered by the TiC layer in the ohmic layer, the dispersed carbon is directly precipitated as graphite on the surface of that $Ni_2Si$ layer. This results in a mixed situation of the TiC layer and graphite on the surface of the ohmic layer and, it is considered that as the area of graphite increases, the adhesive strength of the back surface three-layer metal with the Ti layer decreases, eventually leading to the peeling of the back surface three-layer metal.

For verification, the peeling situations of the back surface three-layer metal were compared between the case of performing the annealing after the Schottky metal formation and the annealing at the time of curing of polyimide and the case without the annealing. The evaluating method is the same as the above method. As a result, the peeling of the back surface three-layer metal was recognized only when the annealing was performed, and the validity of the mechanism was proved.

It was found that the pealing occurs due to the mechanism described above even though the ohmic layer surface is covered by the TiC layer.

EXAMPLES

Examples for preventing the peeling of the back surface three-layer metal will hereinafter be described in order.

A 4H-SiC wafer was used for a wafer acting as a substrate and, for example, an n-type epitaxial layer with an impurity concentration of $1\times10^{16}$ $cm^{-3}$ and a film thickness of 10 μm was grown on a (0001) Si surface of the wafer. An element was produced on the epitaxial layer by a general method. Subsequent steps of forming a front surface electrode and a back surface electrode will hereinafter be described as the examples. Although a Schottky barrier diode is taken as an example in the following description, the present invention is applicable to any vertical elements such as pin (p-intrinsic-n) diodes, insulated gate field-effect transistors (MOSFETs), and insulated gate bipolar transistors (IGBTs).

Example 1

After dipping the wafer into buffered hydrofluoric acid solution to remove an oxide film covering the wafer back surface, a thin layer including Ni and a thin layer including Ti are sequentially deposited on the wafer back surface. The deposition method in this case may be any method such as a sputtering method, an electron beam deposition method, and a resistance heating deposition method. The thin layer including Ni and the thin layer including Ti may be stacked sequentially, or an alloy target of Ni and Ti may be used for concurrent vapor deposition of Ni and Ti by a sputtering method or a multi-source deposition method to form a thin layer including alloy of Ni and Ti.

A film thickness of the Ni layer in this case must be set within a proper range. If the film thickness of the thin layer including Ni is too thin, sufficient reaction is not achieved between SiC in the wafer and Ni in the thin layer including Ni during subsequent sintering to obtain the ohmic contact with the silicon carbide semiconductor, resulting in an increase in ohmic contact resistance. On the other hand, if the film thickness of the thin layer including Ni is too thick, a resistance component is not negligible in the $Ni_2Si$ layer formed by the subsequent sintering to obtain the ohmic contact with the silicon carbide semiconductor. From these viewpoints, the proper range of the film thickness of the thin layer including Ni is desirably 20 to 200 nm.

A film thickness of the thin layer including Ti is also set within a proper range. If the film thickness of the thin layer including Ti is too thin, the TiC amount becomes small that is formed on the ohmic layer surface by the subsequent sintering to obtain the ohmic contact with the silicon carbide semiconductor. On the other hand, if the film thickness of the thin layer including Ti is too thick, a resistance component is not negligible in the TiC layer. From these viewpoints, the proper range of the film thickness of the thin layer including Ti is desirably 5 to 100 nm.

Therefore, in Example 1, the film thickness of the thin layer including Ti was changed to 10 nm, 20 nm, 30 nm, and 40 nm relative to the film thickness of 60 nm of the thin layer including Ni so as to examine correlation of the film thicknesses of the thin layer including Ni and the thin layer including Ti with the peeling of the back surface three-layer metal.

The thin layer including Ni and the thin layer including Ti deposited in this way are sintered to obtain the ohmic contact with the 4H-SiC substrate. A retention temperature of the sintering to obtain the ohmic contact with the silicon carbide semiconductor must be 900 degrees C. or higher while the retention time must be one minute or longer, and the ohmic contact resistance can be reduced by increasing the retention temperature and the retention time. The retention temperature of the sintering is generally set to a temperature lower than about 1200 degrees C., which is the melting point of the oxide film, so as not to degenerate the film quality of the oxide film formed on the wafer front side.

To prevent an increase in the ohmic contact resistance due to oxidization of the thin layer including Ni and the thin layer including Ti, a gas atmosphere during the sintering to obtain the ohmic contact with the silicon carbide semiconductor must be a vacuum, Ar, He, $H_2$, and a mixed gas thereof.

From these viewpoints, in Example 1, the sintering conditions to obtain the ohmic contact with the silicon carbide semiconductor are set to the retention temperature during sintering of 1050 degrees C., the retention time of two minutes, and a sintering atmosphere Ar at normal pressure.

The steps after formation of the ohmic layer (TiC layer+ $Ni_2Si$ layer) are performed in the order of the Schottky contact hole formation step, the Schottky metal formation step, the Al—Si metal formation step, the polyimide formation step, and the back surface three-layer metal formation step as described above.

The steps affecting the ohmic layer making up the back surface electrode in this case are the buffered hydrofluoric acid treatment at the time of Schottky contact hole formation, the ammonia hydrogen peroxide water treatment at the time of Schottky metal patterning and the sintering to obtain the Schottky contact with the silicon carbide semiconductor in the Schottky metal formation, the phosphoric nitric acetic acid treatment at the time of the Al—Si metal formation, the annealing at the time of curing polyimide, and the buffered hydrofluoric acid treatment immediately before the back surface three-layer metal formation. Among these steps, the chemical solution treatment conditions are uniquely determined for complete patterning of the oxide film formed on the wafer front side, the Schottky metal, and the Al—Si metal with the chemical solutions. Temperature, time, and atmosphere are also uniquely determined for the sintering to obtain the Schottky contact with the silicon carbide semiconductor (for forming the Schottky metal) depending on required Schottky interface characteristics. For the polyimide formation, the condition of the sintering to obtain the Schottky contact with the silicon carbide semiconductor is uniquely determined depending on material and film thickness. Therefore, details of these conditions will not be described.

Figure 8:
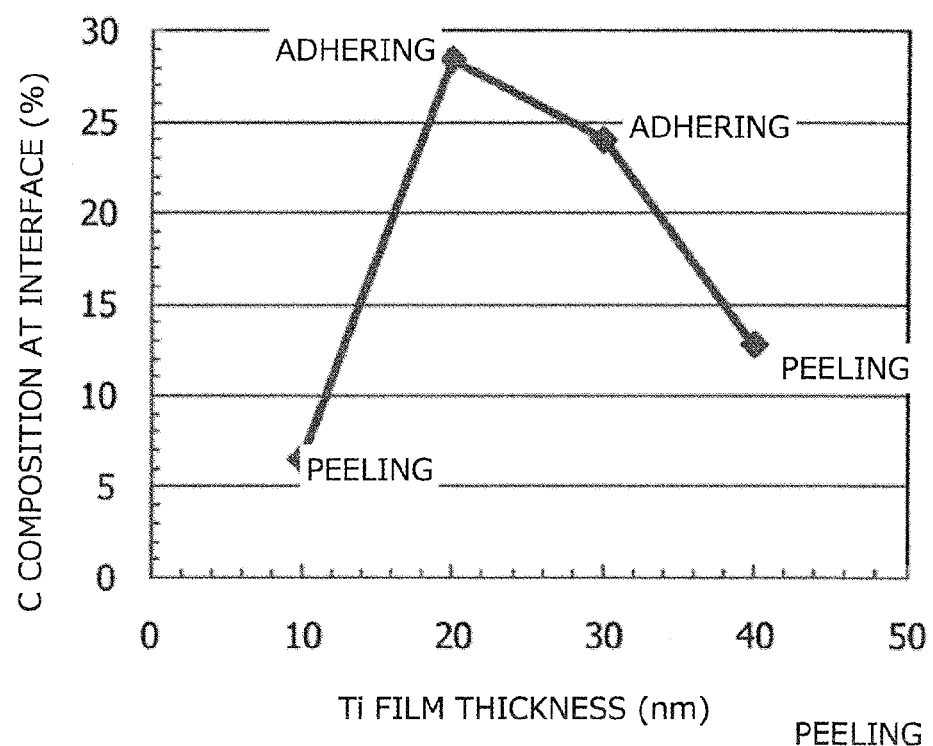
FIG. 8 is a diagram of correlation of a TiC-derived carbon composition at an interface between an ohmic layer and a Ti layer of a back surface three-layer metal with the presence/absence of peeling of the back surface three-layer metal.

The element produced as described above was evaluated on the presence/absence of peeling of the back surface three-layer metal by the tape peeling test described above (tape adhesive force: 6.4 to 9.4 N/25 mm). The TiC-derived carbon composition was examined with XPS at the interface between the ohmic layer and the Ti layer of the back surface three-layer metal. The results are summarized in FIG. 8. FIG. 8 is a diagram of correlation of the TiC-derived carbon composition at the interface between the ohmic layer and the Ti layer of the back surface three-layer metal with the presence/absence of peeling of the back surface three-layer metal. In FIG. 8, the horizontal axis indicates film thickness (Ti film thickness) of the thin layer including Ti deposited for forming the ohmic layer and the vertical axis indicates the TiC-derived carbon composition at the interface between the ohmic layer and the Ti layer of the back surface three-layer metal.

As depicted in FIG. 8, when the film thickness of the thin layer including Ti was 10 nm and 40 nm, the peeling of the back surface three-layer metal occurred. In contrast, when the film thickness of the thin layer including Ti was 20 nm and 30 nm, the peeling of the back surface three-layer metal did not occur. The TiC-derived carbon composition proportion was 12.3% at maximum when the back surface three-layer metal peeled and 24.0% at minimum when the back surface three-layer metal did not peel, which was coincident with past experimental results. From FIG. 8, it is found that the preferred conditions not generating the peeling between the ohmic layer and the Ti layer of the back surface three-layer metal are the film thickness of the thin layer including Ti with the carbon composition of 15% ranging from 15 nm to 40 nm and a Ti/Ni film thickness ratio of the thin layer including Ti and the thin layer including Ni ranging from 0.25 to 0.67.

Example 2

Example 2 will be described. In Example 2, a step of depositing a thin Ti film on a surface including the TiC layer of the ohmic layer on the back surface is added after the sintering for the ohmic layer formation (sintering to obtain the ohmic contact with the silicon carbide semiconductor) in the method of forming the back surface three-layer metal described in Example 1. In this case, the film thickness of the thin Ti film is made sufficiently thick so as not to expose the TiC layer due to wet etching with ammonia hydrogen peroxide water performed at a subsequent step. This thin Ti film is not etched by phosphoric nitric acetic acid treatment performed at a subsequent step. This thin Ti film is removed by the buffered hydrofluoric acid treatment before the back surface three-layer metal. Therefore, this thin Ti film acts as a protection film of the TiC layer (hereinafter referred to as a thin Ti protection film). The other steps are the same as Example 1.

Figure 9:
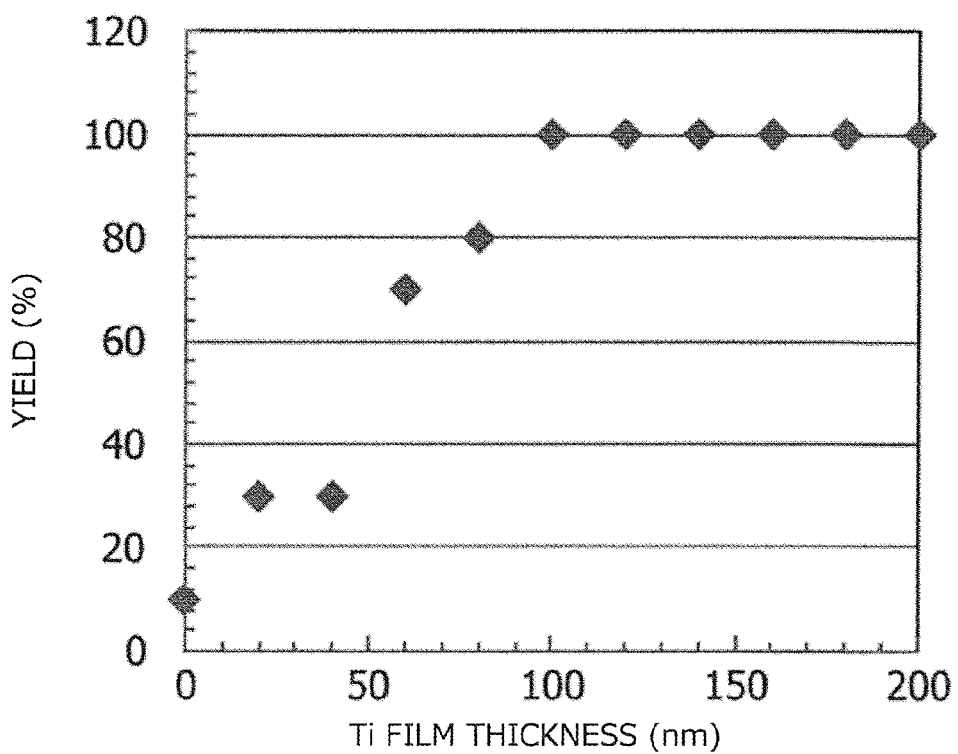
FIG. 9 is a diagram of correlation between film thickness of a thin Ti protection film and yield (rate of elements without peeling) in Example 2.

FIG. 9 is a diagram of correlation between film thickness of the thin Ti protection film and yield (a rate of elements without peeling) in Example 2. When Schottky metal including Ti was deposited with a film thickness of 100 nm on the wafer front side, the film thickness of the thin Ti protection film deposited on the ohmic layer on the wafer backside was changed to examine the correlation with the peeling. The film thickness of the thin Ti protection film was changed from 0 nm to 200 nm stepwise by 20 nm to prepare 10 elements for each film thickness. The peeling test was conducted for these elements with the tape used in the description to examine the correlation between film thickness of the thin Ti protection film and yield by using a rate of elements without peeling of the back surface three-layer metal as the yield. The result is depicted in FIG. 9. In FIG. 9, the horizontal axis indicates the film thickness (Ti film thickness) of the thin Ti protection film and the vertical axis indicates the yield.

As depicted in FIG. 9, since the yield increased from 10% to 30% by merely increasing the thin Ti protection film from 0 nm to 20 nm, the effect of the present invention was confirmed. As the film thickness of the thin Ti protection film increased, the yield also increased and, when the film thickness of the thin Ti protection film was 100 nm or more, the yield reached 100%.

Example 3

Example 3 will be described. In Example 3, a wafer with a Schottky barrier diode produced to have back surface structure according to the present invention was diced into chips and, after picking up this chip, the chip back surface was bonded to a TO-220 lead frame by solder adhesion and an anode electrode of the chip front surface was bonded to a TO-220 lead frame by Al wire bonding. A power cycle test was conducted by periodically repeating turning on/off of the element such that ATc=90 degrees C. is achieved. The result is depicted in FIG. 10. FIG. 10 is a diagram of the result of the power cycle test. In FIG. 10, the horizontal axis indicates the number of cycles (Stress Cycle) and the vertical axis indicates forward voltage V.

As apparent from the results depicted in FIG. 10, in a silicon carbide semiconductor device using a conventional technique, an increase in the forward voltage was recognized at several thousand cycles and the peeling of the back surface three-layer metal was confirmed by ultrasound examination.

On the other hand, when the same power cycle test was conducted for a silicon carbide semiconductor device using the processes according to the present invention, the forward voltage was constant even after 15000 cycles without the peeling of the back surface three-layer metal, and the effect of the present invention was confirmed.

Industrial Applicability

As described above, the silicon carbide semiconductor element and the fabrication method thereof according to the present invention are useful for a power semiconductor device used for a power semiconductor element, etc.

The invention claimed is:

1. A silicon carbide semiconductor element comprising:
a structure in which a thin film of $Ni_2Si$ and TiC formed by sintering after deposition of a thin layer including Ni and a thin layer of Ti is disposed on a silicon carbide substrate and has a layer including TiC formed by TiC precipitation on a surface, wherein
the silicon carbide semiconductor element is further structured such that a multilayer thin film is formed on a surface of the layer including TiC, the multilayer thin film including a Ti layer as a first thin film and an Ni layer as a second thin film, and
a composition ratio of C derived from the layer including TiC is 15% or more at an interface between the layer including TiC and the Ti layer of the multilayer thin film.

2. A fabrication method of the silicon carbide semiconductor element according to claim 1, at least comprising:
a process (A) of depositing a thin layer including Ni and a thin layer including Ti on the silicon carbide substrate;
a process (B) of sintering after the process (A) of depositing the thin layers, to form a thin film including $Ni_2Si$ and TiC on the silicon carbide substrate such that the TiC precipitates on a surface to form a layer including TiC; and
a process (C) of forming a multilayer thin film including the Ti layer as the first thin film and the Ni layer as the second thin film on the surface of the layer including TiC, wherein
at the process (A) of depositing the thin layers, a film thickness ratio (Ti/Ni) of the thin layer including Ti and the thin layer including Ni is set to 0.25 to 0.67.

3. The fabrication method of the silicon carbide semiconductor element according to claim 2, comprising
a process (D) of depositing a thin film including Ti, the process (D) being performed between the process (B) of performing the sintering and the process (C) of forming the multilayer thin film.

* * * * *